[12] United States Patent  
Batson (10) Patent No.: US 7,012,404 B2  
(45) Date of Patent: Mar. 14, 2006

(54) BATTERY COVER ASSEMBLY HAVING INTEGRATED BATTERY CONDITION MONITORING

(75) Inventor: David C. Batson, Winchester, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 10/419,600

(22) Filed: Apr. 21, 2003

(65) Prior Publication Data

US 2004/0012396 A1 Jan. 22, 2004

Related U.S. Application Data

(63) Continuation of application No. 10/010,693, filed on Dec. 5, 2001, now Pat. No. 6,628,102
(60) Provisional application No. 60/282,133, filed on Apr. 6, 2001.

(51) Int. Cl.  
*H02J 7/00* (2006.01)

(52) U.S. Cl. ...................................... 320/107; 320/104
(58) Field of Classification Search ................ 320/107, 320/104, 112, 127, 128, 136; 429/96, 97, 429/98, 99, 100; 324/426, 428; 439/426, 439/435

See application file for complete search history.

(56) References Cited

U.S. PATENT DOCUMENTS

| | | | | |
|---|---|---|---|---|
| 3,660,759 A | 5/1972 | Parmater | ................... | 324/29.5 |
| 4,021,718 A | 5/1977 | Konrad | ................... | 320/48 |
| 4,045,721 A | 8/1977 | Swain | ................... | 320/43 |
| 4,081,693 A | * 3/1978 | Stone | ................... | 307/66 |
| 4,180,770 A | 12/1979 | Eby | ................... | 324/429 |
| 4,193,025 A | 3/1980 | Frailing et al. | ................... | 324/427 |
| 4,349,775 A | 9/1982 | Kwon et al. | ................... | 320/35 |
| 4,396,880 A | 8/1983 | Windebank | ................... | 320/21 |
| 4,460,870 A | 7/1984 | Finger | ................... | 324/429 |
| 4,470,654 A | * 9/1984 | Friedman | ................... | 439/435 |
| 4,558,281 A | 12/1985 | Codd et al. | ................... | 324/433 |
| 4,564,798 A | 1/1986 | Young | ................... | 320/6 |
| 4,583,036 A | 4/1986 | Morishita et al. | ................... | 320/39 |
| 4,629,964 A | 12/1986 | Ball | ................... | 320/14 |
| 4,678,998 A | 7/1987 | Muramatsu | ................... | 324/427 |
| 4,709,202 A | 11/1987 | Koenck et al. | ................... | 320/43 |
| 4,876,513 A | 10/1989 | Brilmyer et al. | ................... | 324/427 |

(Continued)

OTHER PUBLICATIONS

PowerSmart Product Data, PS3180 SmartShunt TM Battery Monitor, 2000, Rev. A, pp. 1–2 and 1–6, 2000.

Microchip Technology, Inc., 12V Battery Monitor with LIN Communications Interface, DS21803A, pp. 1–4, Mar. 25, 2003.

*Primary Examiner*—Donald Sparks  
*Assistant Examiner*—Lawrence Luk  
(74) *Attorney, Agent, or Firm*—Baker Botts L.L.P.

(57) ABSTRACT

A terminal assembly for measuring electrical current passing to and from a battery post, including an electrically conductive collar for connecting to a post of a battery, and an electrically conductive terminal for receiving a connector of a load. An electrically conductive resistor having a known resistance extends between outer surfaces of the collar and the terminal. The terminal assembly is incorporated into a battery, which also includes a volt meter connected between the outer surfaces of the collar and the terminal for measuring the voltage drop across the resistor, memory for storing the known resistance of the resistor, and a processor programmed to receive the measured voltage drop from the volt meter, retrieve the known resistance from the memory, and calculate current flow through the resistor based on the measured voltage drop and the known resistance, whereby current flow to and from the battery can be measured.

15 Claims, 7 Drawing Sheets

U.S. PATENT DOCUMENTS

| | | | | |
|---|---|---|---|---|
| 4,924,176 A | * | 5/1990 | Tremblay | 324/133 |
| 4,937,528 A | | 6/1990 | Palanisamy | 324/430 |
| 4,947,123 A | | 8/1990 | Minezawa | 324/427 |
| 4,968,942 A | | 11/1990 | Palanisamy | 324/430 |
| 5,047,961 A | | 9/1991 | Simonsen | 364/550 |
| 5,049,803 A | | 9/1991 | Planisamy | 320/20 |
| 5,132,626 A | | 7/1992 | Limuti et al. | 324/432 |
| 5,160,880 A | | 11/1992 | Palanisamy | 320/32 |
| 5,191,291 A | | 3/1993 | Taylor | 324/429 |
| 5,250,904 A | | 10/1993 | Salander et al. | 324/430 |
| 5,281,919 A | | 1/1994 | Palanisamy | 324/427 |
| 5,321,347 A | | 6/1994 | Chien | 320/21 |
| 5,321,627 A | | 6/1994 | Reher | 364/483 |
| 5,339,018 A | | 8/1994 | Brokaw | 320/35 |
| 5,345,163 A | | 9/1994 | Gibbons et al. | 320/48 |
| 5,432,429 A | | 7/1995 | Armstrong, II et al. | 320/43 |
| 5,469,043 A | | 11/1995 | Cherng et al. | 320/31 |
| 5,541,489 A | | 7/1996 | Dunstan | 320/2 |
| 5,546,317 A | | 8/1996 | Andrieu | 364/481 |
| 5,550,475 A | | 8/1996 | Shafer | 324/433 |
| 5,565,759 A | | 10/1996 | Dunstan | 320/48 |
| 5,572,110 A | | 11/1996 | Dunstan | 320/30 |
| 5,598,088 A | | 1/1997 | Richter | 320/48 |
| 5,600,230 A | | 2/1997 | Dunstan | 320/48 |
| 5,617,007 A | | 4/1997 | Keidl et al. | 320/22 |
| 5,627,453 A | | 5/1997 | Sheehan et al. | 320/30 |
| 5,629,680 A | * | 5/1997 | Makhija | 340/664 |
| 5,631,540 A | | 5/1997 | Nguyen | 320/30 |
| 5,635,820 A | | 6/1997 | Park | 320/30 |
| 5,652,069 A | * | 7/1997 | Sakai et al. | 429/92 |
| 5,656,920 A | | 8/1997 | Cherng et al. | 320/31 |
| 5,659,240 A | | 8/1997 | King | 320/30 |
| 5,670,863 A | | 9/1997 | Broell et al. | 320/22 |
| 5,708,348 A | | 1/1998 | Frey et al. | 320/21 |
| 5,710,503 A | | 1/1998 | Sideris et al. | 320/6 |
| 5,710,506 A | | 1/1998 | Broell et al. | 320/522 |
| 5,734,252 A | | 3/1998 | Griffin et al. | 320/2 |
| 5,739,670 A | | 4/1998 | Brost et al. | 320/14 |
| 5,808,445 A | | 9/1998 | Aylor et al. | 320/132 |
| 5,825,156 A | | 10/1998 | Patillon et al. | 320/21 |
| 5,828,201 A | | 10/1998 | Hoffman, Jr. et al. | 320/104 |
| 5,841,284 A | | 11/1998 | Takahashi | 324/428 |
| 5,889,382 A | | 3/1999 | Jung | 320/106 |
| 5,903,764 A | | 5/1999 | Shyr et al. | 395/750.01 |
| 5,923,148 A | | 7/1999 | Sideris et al. | 320/116 |
| 5,936,385 A | | 8/1999 | Patillon et al. | 320/136 |
| 5,949,219 A | | 9/1999 | Weiss | 320/136 |
| 5,994,876 A | | 11/1999 | Canny et al. | 320/132 |
| 6,001,506 A | | 12/1999 | Timmons et al. | 429/178 |
| 6,285,164 B1 | | 9/2001 | Noda et al. | 320/132 |
| 6,377,030 B1 | * | 4/2002 | Asao et al. | 320/161 |
| 6,399,244 B1 | | 6/2002 | Hinotu et al. | 429/179 |
| 6,507,196 B1 | * | 1/2003 | Thomsen et al. | 324/436 |
| 6,573,723 B1 | * | 6/2003 | Baston | 324/426 |
| 6,628,102 B1 | | 9/2003 | Batson | 320/128 |
| 2002/0128791 A1 | * | 9/2002 | Chen et al. | 702/99 |

* cited by examiner

BATTERY COVER ASSEMBLY HAVING INTEGRATED BATTERY CONDITION MONITORING

RELATED APPLICATIONS

This application is a continuation patent application of commonly owned U.S. patent application Ser. No. 10/010,693, filed Dec. 5, 2001, entitled "Current Measuring Terminal Assembly for a Battery", by David C. Batson, which issued to U.S. Pat. No. 6,628,102 B2 on Sep. 20, 2003, and which itself claims priority to provisional U.S. patent application Ser. No. 60/282,133, filed on Apr. 6, 2001, which is assigned to the assignee of the present patent application, and both are incorporated by reference herein for all purposes.

BACKGROUND OF THE INVENTION

1. Technical Field of the Disclosure

The present disclosure relates to batteries and, more particularly, to a terminal assembly for measuring current flow to and from a post of a battery. Even more particularly, the present disclosure relates to a battery incorporating a terminal assembly for measuring current flow to and from a post of the battery.

2. Background of the Disclosure

The present disclosure is described in conjunction with a lead-acid battery of the, type used to provide starting power for the internal combustion engine in vehicles, such as automobiles, trucks and motorcycles and or motive power for electric and hybrid-electric vehicles. This type of battery generally includes a plastic casing containing positive and negative lead plates immersed in an acid electrolyte. The plates are separated by nonconductive sheets, and a positive lead strap connects the positive plates while a negative lead strap connects the negative plates. Lead posts are connected to each strap and extend through the casing, and lead positive and negative battery terminals are secured to the ends of the posts outside the casing for receiving cable connectors.

In present day vehicle systems there is generally no means to ascertain the status of the battery beyond the alternator output voltage. Presently, means for monitoring the status of batteries normally measures the voltage provided between the battery terminals. However, battery voltage in itself provides limited information as to battery status and performance beyond measurement of open circuit voltage and an estimate of the battery state-of-charge based on the measured open circuit voltage. What is desired instead is an integral intelligent battery which provides means for measuring the flow of current into and out of the battery as well as the battery terminal voltage and battery temperature and contains electronics means to communicate and analyze these battery measures. The measures of current, voltage and temperature can then be used over time to calculate and monitor the level of charge of the battery. The preferred battery design solution would also provide means to incorporate microelectronic circuitry capable of utilizing these measures without adversely impacting the size and utility of the subject battery. The integrated microelectronic circuitry is then utilized to provide analysis and communication of battery performance and remaining capacity based on these measures. Preferably, the terminal assembly and cover assembly will be simple in design, and easily incorporated in a battery within the battery manufacturers current manufacturing capabilities. What is also desired is a battery including an integrated terminal assembly for monitoring the flow of current into and out of the battery.

SUMMARY OF THE DISCLOSURE

In response, the present disclosure provides a battery cover assembly which provides the integral means for measuring electrical current passing to and from a battery post, means to measure the battery terminal voltage as well as means to integrate electronic circuitry within the existing physical envelope of the battery. The battery cover assembly further incorporates at least one terminal assembly for the measurement of current flow. The terminal assembly includes an electrically conductive collar having an inner surface for connecting to a battery post and an outer surface, and an electrically conductive terminal having an outer surface for receiving a cable connector, for example, of a vehicle. The assembly also includes an electrically conductive resistor having a known resistance extending between the outer surfaces of the collar and the terminal. Current flow from the battery post travels through the resistor from the collar to the terminal and current flow to the post travels through the resistor from the terminal to the collar.

According to one aspect, the resistor of the terminal assembly is made from a metallic alloy material including manganese, nickel and copper, which provides a very low temperature coefficient of resistivity.

The present disclosure also provides a battery post cover for receipt on a battery having at least one battery post extending therefrom. The cover includes the terminal assembly discussed above and further includes a first surface having a terminal port, a second surface having a post port, and wherein the cover defines a closed chamber. A circuit board is received in the closed chamber, and the terminal assembly is received in the cover with the terminal extending out of the terminal port and the collar positioned in the post port for receiving a battery post. Leads extend from the outer surfaces of the terminal and the collar of the terminal assembly into the closed chamber of the cover, and are electrically connected to the circuit board. These leads further provide the means to mechanically secure the circuit board to the cover as well as provide the electrical connections to the current sensing resistor and the opposing polarity battery terminal to measure battery terminal voltage.

According to one aspect of the present disclosure, a voltage measuring means is mounted on the circuit board and connected between the first and the second leads of the terminal assembly for measuring the voltage drop across the resistor.

According to another aspect of the present disclosure, a voltage measuring means is mounted on the circuit board and connected between the first leads of the terminal assembly and the leads of the opposing polarity battery terminal for measuring the voltage potential across the battery terminals.

According to another aspect, a computer is also mounted on the circuit board. The computer has memory storing the known resistance of the resistor, and a processor programmed to receive the measured voltage drop from the voltage measuring means, retrieve the known resistance from the memory, and calculate current flow through the resistor based on the measured voltage drop and the known resistance.

According to a further aspect, the battery post cover includes a thermometer for measuring an actual temperature of the resistor, and the memory of the computer also stores a temperature coefficient of resistivity for the resistor. In addition, the processor is programmed to receive the actual temperature from the thermometer, retrieve the temperature coefficient of resistivity from the memory, calculate an actual resistance of the resistor based on the known resistance, the temperature coefficient of resistivity, and the actual temperature, and calculate actual current flow through the resistor based on the measured voltage drop and the actual resistance.

The present disclosure also provides a battery including the battery post cover, and further including a case, a storage cell contained within the case for receiving and storing an electrical charge, and an electrically conductive post connected to the storage cell and extending out of the case. The post extends into the post port of the cover and is received by the collar of the terminal assembly.

According to one aspect of the present disclosure, the storage cell of the battery includes lead and lead-oxide plates immersed in an acid electrolyte.

These and other aspects of the present disclosure will become apparent to those skilled in the art after a reading of the following description of the preferred embodiment when considered with the drawings.

BRIEF DESCRIPTION OF THE DRAWINGS

The present disclosure is described with reference to the accompanying drawings, wherein.

Like reference characters designate identical or corresponding components and units throughout the several views.

DETAILED DESCRIPTION OF THE DISCLOSURE

Figure 1:
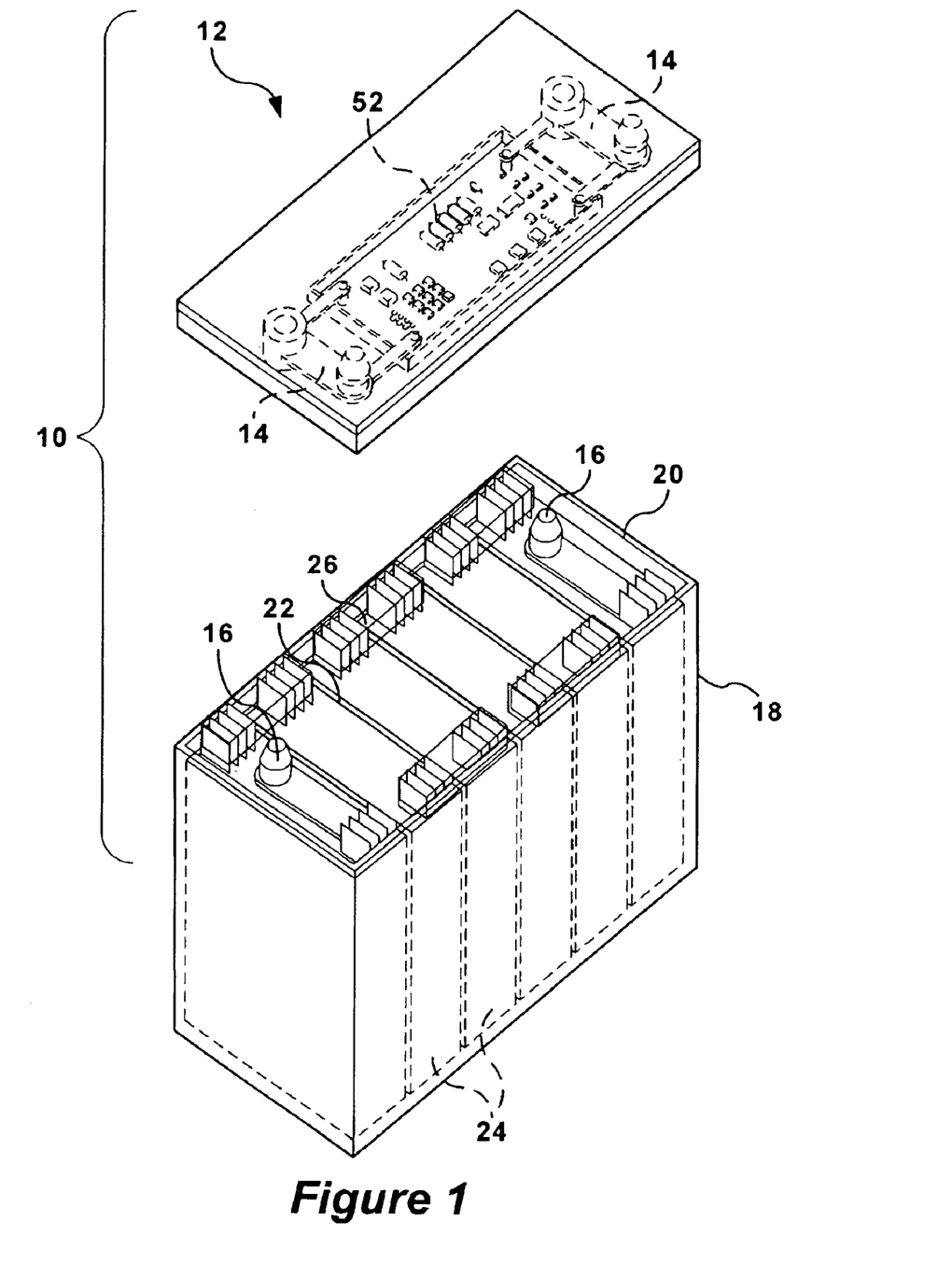
FIG. 1 is an exploded perspective end view of a battery constructed in accordance with the present disclosure.
Figure 2:
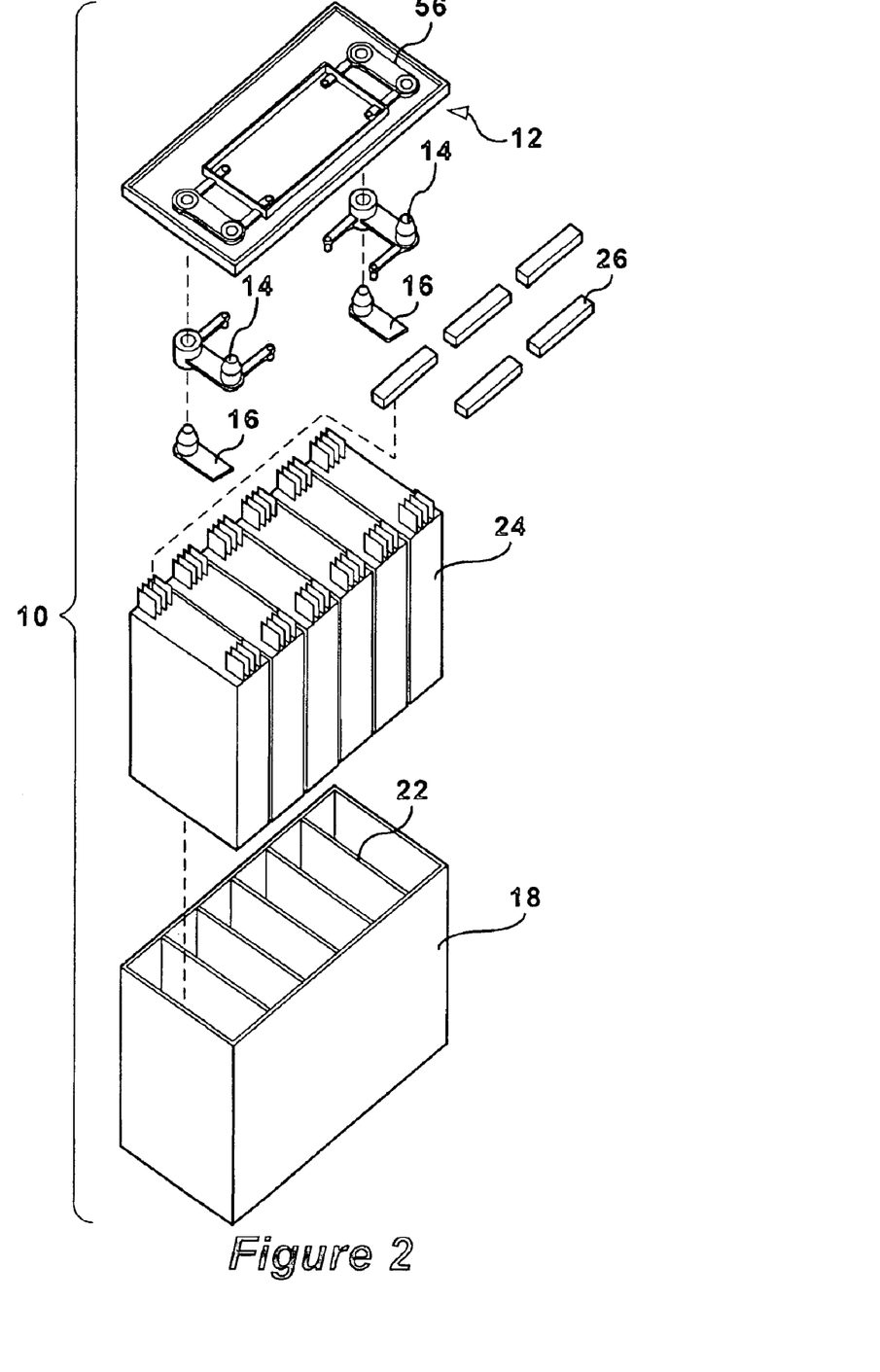
FIG. 2 is a reduced, exploded perspective side view of the battery of FIG. 1, with an outer portion of a cover of the battery not shown.
Figure 3:
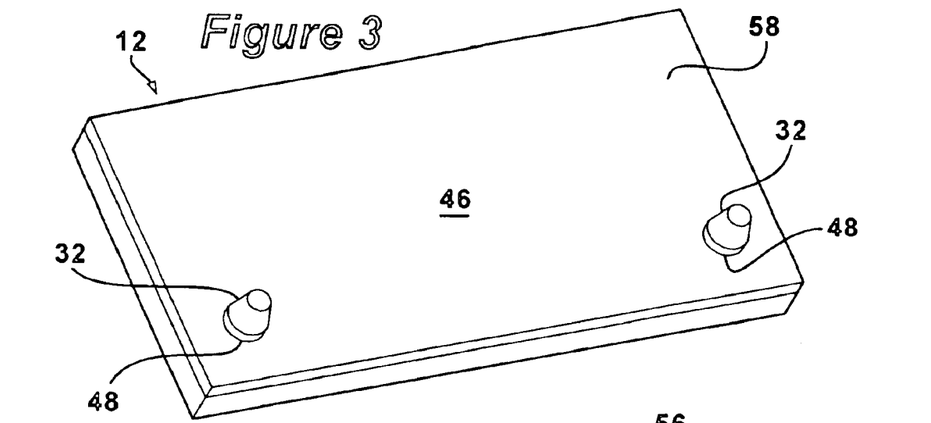
FIG. 3 is an enlarged perspective top view of a cover of the battery of FIG. 1.
Figure 4:
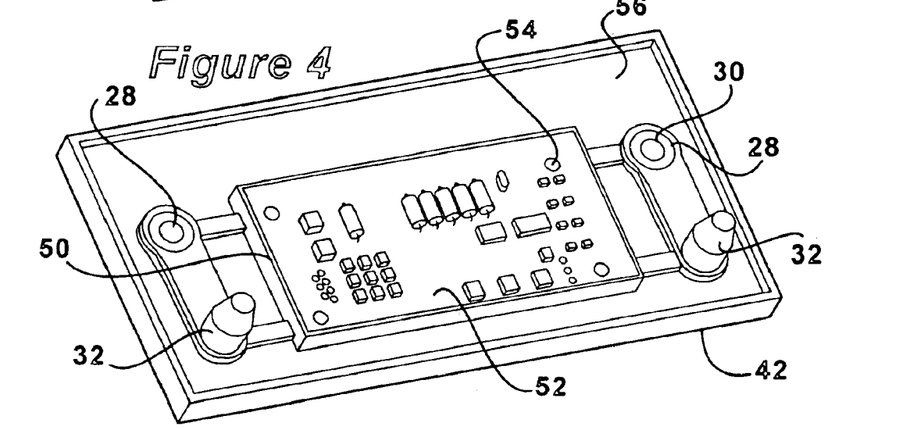
FIG. 4 is an enlarged perspective top view of an inner portion of the cover of the battery of FIG. 1, including a circuit board and two terminal assemblies.
Figure 5:
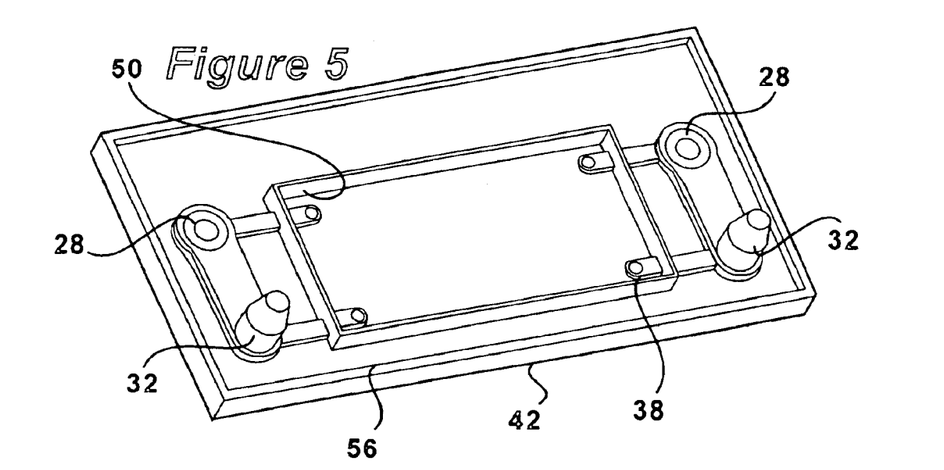
FIG. 5 is an enlarged perspective top view of an inner portion of the cover of the battery of FIG. 1, including the two terminal assemblies.
Figure 6:
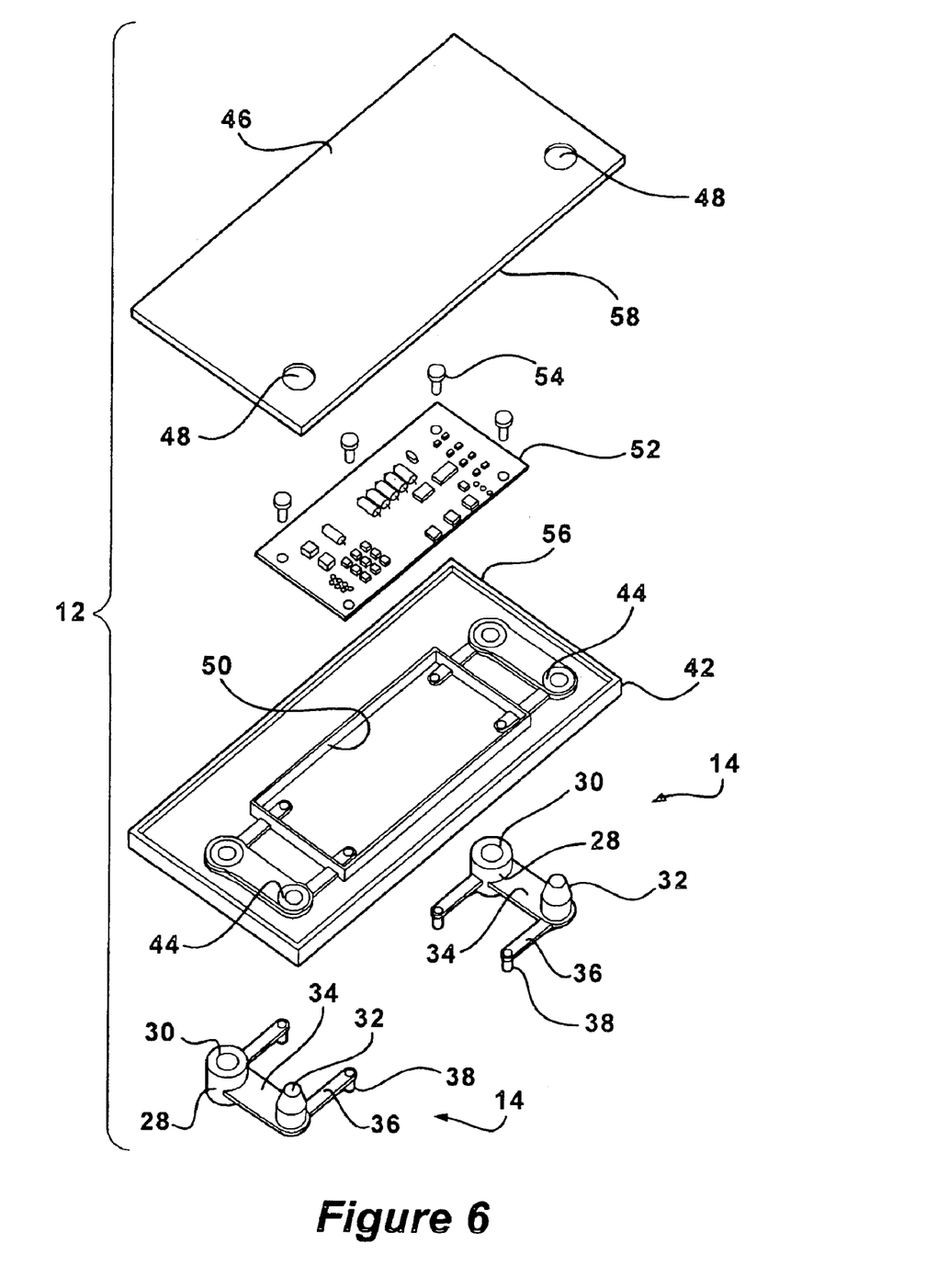
FIG. 6 is an enlarged, exploded perspective side view of the cover of the battery of FIG. 1, including the outer portion, the inner portion, the circuit board, and the two terminal assemblies.
Figure 7:
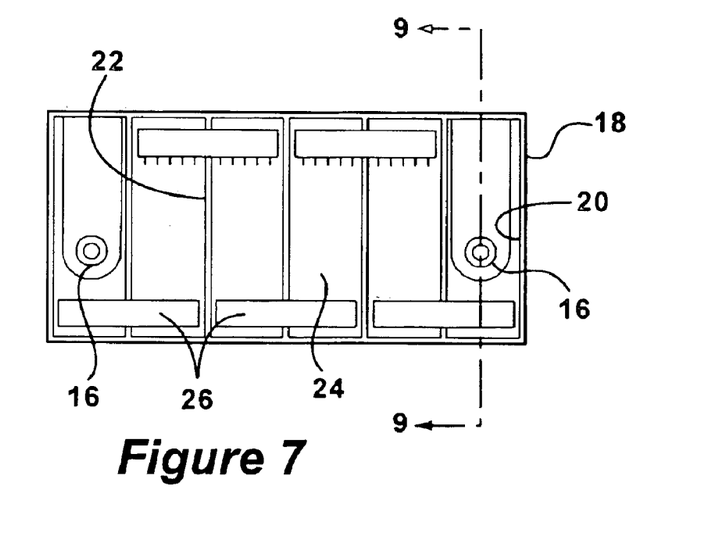
FIG. 7 is a top plan view of the battery of FIG. 1, with the cover of the battery removed.
Figures 8, 9:
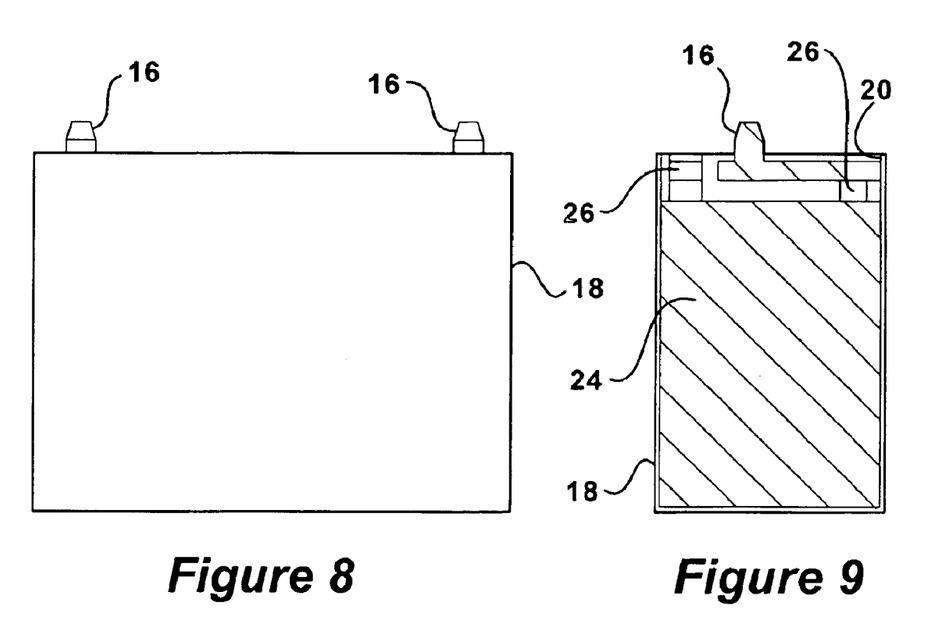
FIG. 8 is a side elevation view of the battery of FIG. 1, with the cover of the battery removed.
FIG. 9 is a sectional view of the battery of FIG. 1, without the cover, taken along line 9—9 of FIG. 7.
Figure 10:
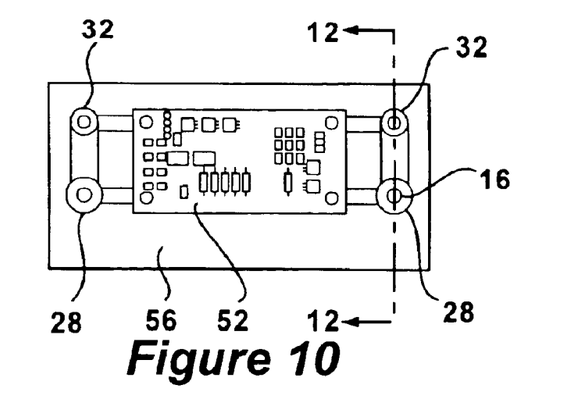
FIG. 10 is a top plan view of the battery of FIG. 1, with the outer portion of the cover removed.
Figure 11:
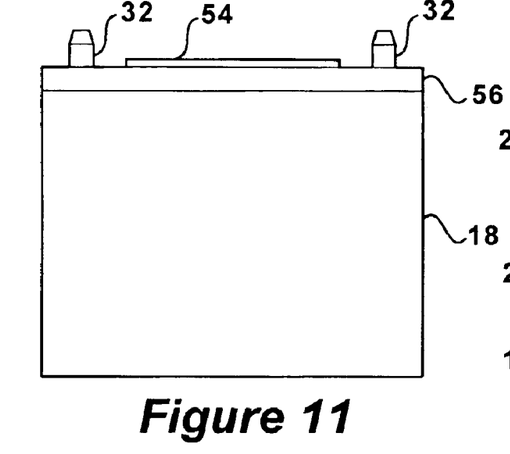
FIG. 11 is a side elevation view of the battery of FIG. 1, with the outer portion of the cover removed.
Figure 12:
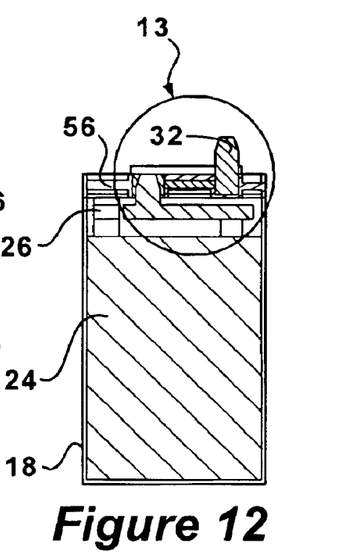
FIG. 12 is a sectional view of the battery of FIG. 1, with the outer portion of the cover removed, taken along line 12—12 of FIG. 10.
Figure 13:
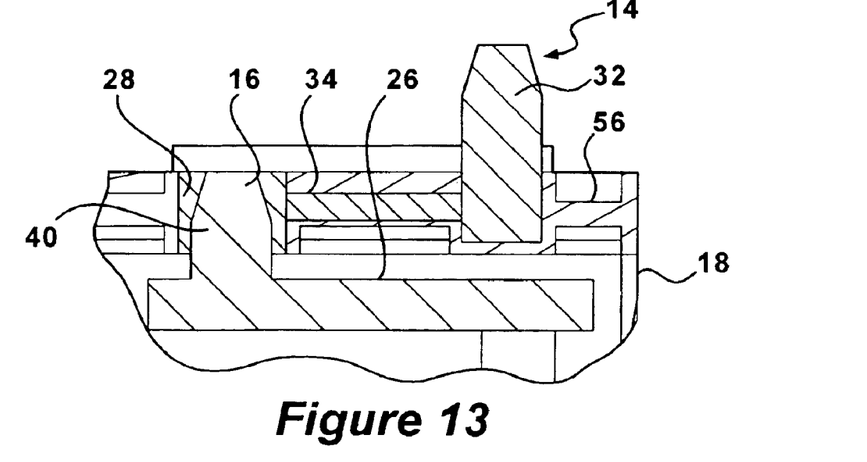
FIG. 13 is an enlarged sectional view of the battery of FIG. 1, with the outer portion of the cover removed, and as contained within the circled portion 13 of FIG. 12.

Referring to FIGS. 1 through 13, the present disclosure provides a battery 10 including a battery post cover 12 having terminal assemblies 14 for measuring electrical energy passing to and from posts 16 of the battery 10. The battery 10 is generally similar to typical lead-acid 12 Volt and 36 Volt batteries for use in powering vehicles, such as trucks, automobiles and motorcycles. It should be understood, however, that the present disclosure can be used with many different types of batteries other than lead-acid batteries, such as nickel metal hydride, lithium ion, and lithium polymer batteries.

As shown in FIGS. 1, 2 and 7 through 13, the battery 10 includes a plastic casing 18 having an open top 20 and cell dividers 22 separating fuel cells 24. Each fuel cell 24 contains positive and negative lead plates separated by non-conductive sheets and immersed in an acid electrolyte. The battery 10 also includes positive lead straps 26 connecting the positive plates and negative lead straps 26 connecting the negative plates. The positive lead post 16 is connected to the positive plates, while the negative lead post 16 is connected to the negative plates. Both posts 16 extend out of the open top 20 of the case 18.

Figure 14:
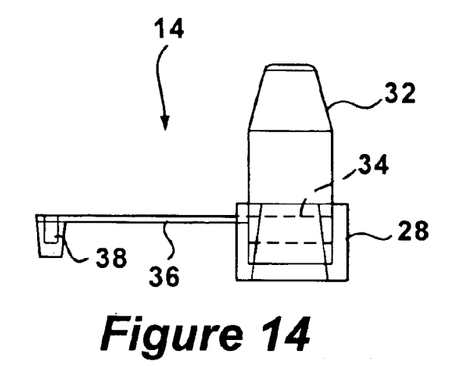
FIG. 14 is a side elevation view of one of the terminal assemblies of the battery of FIG. 1.
Figure 15:
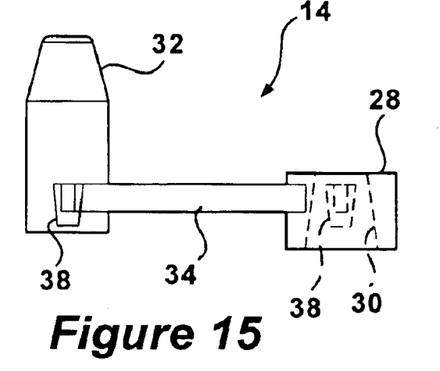
FIG. 15 is an end elevation view of the terminal assembly of the battery of FIG. 1.
Figure 16:
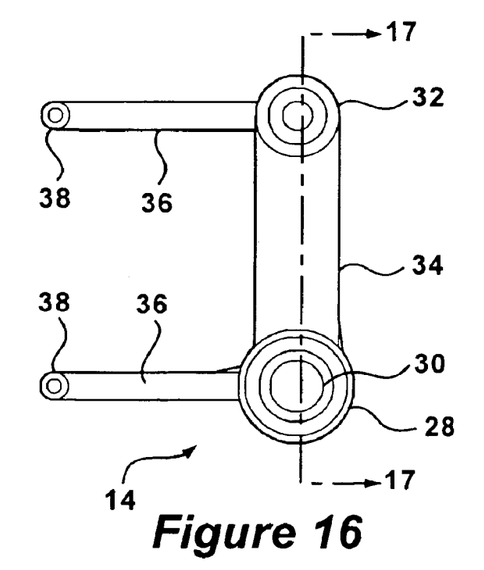
FIG. 16 is a top plan view of one of the terminal assembly of the battery of FIG. 1.
Figure 17:
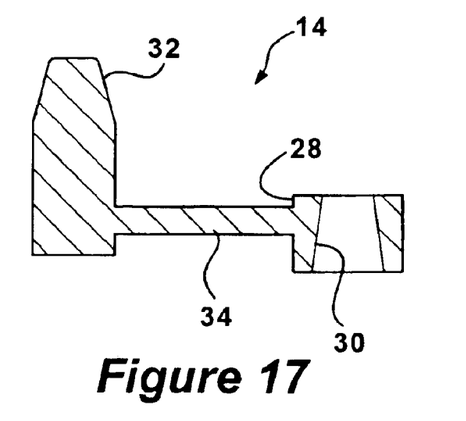
FIG. 17 is a sectional view of the terminal assembly of the battery of FIG. 1, taken along line 17—17 of FIG. 16.

Referring to FIGS. 1, 2 and 14 through 17, each terminal assembly 14 includes an electrically conductive collar 28 having an inner surface 30 for contacting the battery post 16, and an electrically conductive terminal 32 for receiving a connector (not shown) of a load, such as a cable clamp of a vehicle. Each assembly 14 also includes an electrically conductive shunt resistor 34 having a known resistance "R" extending between outer surfaces of the collar 28 and the terminal 32. Current flow "I" from the battery post 16 travels through the resistor 34 from the collar 28 to the terminal 32 and current flow to the battery post 16 travels through the resistor 34 from the terminal 32 to the collar 28. Leads 36 extend from the outer surfaces of the collar 28 and the terminal 32 for measuring a voltage drop "v" across the resistor 34. The leads 36 can include threaded connectors 38, as shown.

The known resistance "R" of the resistor 34 is calculated by multiplying the ratio of length of the resistor 34 divided by the cross sectional area of the resistor 34 by the resistivity of the material that the resistor 34 is made of. The material from which the terminal assembly 32 is made can be lead or a non-lead material, as long as the resistance "R" of the resistor 34 is precisely known for purposes of determining current flow "I". Other conductive materials, such as copper, brass and bronze can alternatively be used, the material selection is based on the galvanic compatibility of the resistor 34 material with the electrochemical system being employed. Also, the resistor 34 can be made from commercially available alloy materials having a very low temperature coefficient of resistivity, such as Manganin, to reduce the effects of temperature variation when determining current flow "I". The resistor 34 can be formed of powdered metal, stamped, machined, cast, or forged. The resistor 34 can also be insert cast with the collar 28 and the terminal 32 if the resistor 34 is made of different materials than the collar 28 and the terminal 32. In addition, the collar 28 and the terminal 32 can be plated or dipped in silver, gold, platinum or their alloys to provide a non-corrosive surface, and further dipped or coated with tin to provide better attachment between the lead battery post and plated collar 28. The inner surface 30 of the collar 28 is secured to the battery post 16, as shown best in FIG. 13, with lead solder 40 for example, to provide an electrical connection and to prevent electrolyte from leaking from the battery 10.

The resistor 34 is configured for use with a typical lead-acid vehicle battery 10 to measure currents between 0.5 amperes and 1000 amperes, with the resistor 34 being provided with a known resistance "R" of between about 50 microOhm and about 200 microOhm. Preferably, the resistor 34 is provided with a known resistance "R" of about 150 microOhm. The resistance value, of course, is determined based on a trade-off between current measurement accuracy and power dissipation at high current.

Referring to FIGS. 1 through 6, the battery post cover 12 is made of a suitably rigid and durable plastic and includes a first surface 42 having two post ports 44, a second surface 46 having two terminal ports 48, and a substantially closed chamber 50 receiving a circuit board 52. The terminal assemblies 14 are received within the cover 12 with the terminals 32 extending through the terminal ports 48, the collars 28 positioned within the post ports 44, and the leads 36 extending into the closed chamber 50 of the cover. The threaded connectors 38 of the leads 36 are electrically connected to lands of the circuit board 52 with screws 54, for example.

A two-piece cover 12 is employed for ease of manufacture, with the terminal assemblies 14 insert molded to an inner portion 56 of the cover. The inner portion 56 is secured to the battery case 18, through ultrasonic welding for example, such that the open top 20 of the case 18 is sealed shut in a fluid-tight manner. Then an outer portion 58 of the cover 12 is secured to the inner portion 56 to secure and protect the circuit board 52 within the cover. The cover 12 can alternatively be formed as a single piece with the terminal assemblies 14 and the circuit board 52 insert molded therein, or can be constructed from more than two pieces.

Although not described in detail herein, the circuit board 52 has arranged and mounted thereon an electrical circuit including components such as a volt meter connected to the leads 36 of at least one of the terminal assemblies 14 for measuring the voltage drops "v" across the resistors 34. The electrical circuit also includes a memory storing the known resistance "R" of the resistors 34 and a processor programmed to receive the measured voltage drop "v" from the volt meter, retrieve the known resistance "R" from the memory, and calculate current flow "I" through the resistors 34 based on the measured voltage drop "v" and the known resistance "R". Other components of the circuit can include an analog-to-digital converter for converting an analog signal from the volt meter to a digital signal for the computer, an indicator such as an LED, and an input/output circuit for connecting the computer to a remote device such as a display screen mounted on the dashboard of a vehicle, or a personal computer with a keyboard, mouse and other user input devices. An example of a circuit for use on the circuit board 52 is the PS3180 SmartShunt™ Battery 10 Monitor available from the assignee of the present disclosure, PowerSmart, Inc. of Needham, Mass. (www.powersmart.com).

If the resistors 34 of the terminal assemblies 14 are made of a material having a relatively high temperature coefficient of resistivity, the circuit board 52 can be provided with a thermometer, such as a solid state silicon thermistor, for measuring an actual temperature of the resistors 34. In such a case 18, the memory of the circuit also stores a temperature coefficient of resistivity for the resistor 34, and the processor is further programmed to receive the actual temperature from the thermometer, retrieve the temperature coefficient of resistivity from the memory, calculate an actual resistance of the resistor 34 based on the known resistance "R" (at a ideal temperature), the temperature coefficient of resistivity, and the actual temperature. The processor is also programmed to calculate actual current flow through the resistor 34 based on the measured voltage drop and the actual resistance.

The circuit board 52 is preferably also provided with a clock and the processor is programmed to calculate the total charge of the battery 10 based on the current flow "I" and the charge time (when current is provided to the battery 10) or the drain time (when current is taken from the battery 10).

The present disclosure, accordingly, provides a new and improved battery 10 including terminal assemblies 14 for monitoring the terminal voltage, the flow of current into and out of the battery 10 and means to mechanically and electrically integrate electronic circuitry for the measure and analysis of battery voltage and current. As preferred, the battery 10 is simple in design, relatively inexpensive and capable of manufacture in high volumes. Certain modifications and improvements will occur to those skilled in the art upon a reading of the foregoing description. By way of example, the outer surfaces of the terminals 32 can include channels for dissipating heat. In addition, the battery post cover 12 disclosed herein can be modified so as able to be retrofit onto the covers of existing batteries. The battery post cover 12 can also be modified so as to include a single terminal assembly 14 for connection to either a positive or negative post 16 of a battery 10. Furthermore, the circuit board 52 of the battery post cover 12 can be provided with additional features and abilities.

It should be understood that all such modifications and improvements are properly within the scope of the following claims. In addition, all embodiments shown and described in the present disclosure are within the scope of at least one of the claims. No embodiments or portions thereof are meant to be dedicated to the public prior to the expiration of any patent obtained for this disclosure.

What is claimed:

1. A terminal assembly for measuring electrical current passing to and from a battery post, comprising:

an electrically conductive collar having an inner surface for contacting a battery post;

an electrically conductive terminal for receiving a load connector;

an electrically conductive resistor having a resistance from about 50 microOhm to about 200 microOhm extending between outer surfaces of the collar and the terminal, wherein current flow from the battery post travels through the resistor from the collar to the terminal and current flow to the post travels through the resistor from the terminal to the collar;

a first lead electrically connected to the outer surface of the collar, and a second lead electrically connected to the outer surface of the terminal;

a volt meter connected between the first and the second leads for measuring the voltage drop across the resistor; and a computer, said computer including:
memory storing the resistance of the resistor; and
a processor programmed to,
receive the measured voltage drop from the volt meter, retrieve the resistance from the memory, and
calculate current flow through the resistor based on the measured voltage drop and the resistance.

2. A terminal assembly according to claim 1, further comprising:
a thermometer for measuring an actual temperature of the resistor;
the memory of the computer also stores a temperature coefficient of resistivity for the resistor; and
the processor of the computer is further programmed to,
receive the actual temperature from the thermometer,
retrieve the temperature coefficient of resistivity from the memory,
calculate an actual resistance of the resistor based on the resistance, the temperature coefficient of resistivity, and the actual temperature, and
calculate actual current flow through the resistor based on the measured voltage drop and the actual resistance.

3. A terminal assembly according to claim 1, wherein the computer further comprises a clock and the processor is programmed to calculate a total charge based on the current flow and the charge time.

4. A terminal assembly according to claim 1, wherein the resistor is made from a material including lead.

5. A terminal assembly according to claim 1, wherein the resistor is made from a material including manganese.

6. A battery including the terminal assembly of claim 1, and further including:
a case;
a storage cell contained within the case for receiving and storing an electrical charge; and
an electrically conductive post connected to the storage cell and extending out of the case;
wherein the inner surface of the collar of the terminal assembly is positioned on a portion of the post extending out of the case.

7. A battery according to claim 6, wherein the storage cell includes lead and lead-oxide plates immersed in an acid electrolyte.

8. A battery post cover for receipt on a battery having at least one battery post extending therefrom, comprising:
a terminal assembly for measuring electrical current passing to and from a battery post, said terminal assembly comprising an electrically conductive collar having an inner surface for contacting a battery post, an electrically conductive terminal for receiving a load connector, and an electrically conductive resistor having a known resistance extending between outer surfaces of the collar and the terminal, wherein current flow from the battery post travels through the resistor from the collar to the terminal and current flow to the post travels through the resistor from the terminal to the collar;
a first surface having a post port;
a second surface having a terminal port, and wherein the cover defines a substantially closed chamber; and
a circuit board received in the closed chamber;
wherein the collar of the terminal assembly is positioned in the post port of the inner cover for receiving a battery post, the terminal extends through the terminal port of the outer cover, and leads extend from the outer surface of the collar and the outer surface of the terminal into the closed chamber of the covers and connect to the circuit board.

9. A battery post cover according to claim 8, wherein the resistor and the leads of the terminal assembly are contained within the cover.

10. A battery post cover according to claim 8, further comprising a volt meter mounted on the circuit board and connected between the first and the second leads of the terminal assembly for measuring the voltage drop across the resistor.

11. A battery post cover according to claim 10, further comprising a computer mounted on the circuit board and including:
memory storing the known resistance of the resistor; and
a processor programmed to,
receive the measured voltage drop from the volt meter,
retrieve the known resistance from the memory, and
calculate current flow through the resistor based on the measured voltage drop and the known resistance.

12. A battery post cover according to claim 11, further comprising:
a thermometer mounted on the circuit board for measuring an actual temperature of the resistor;
the memory also stores a temperature coefficient of resistivity for the resistor; and
the processor is further programmed to,
receive the actual temperature from the thermometer,
retrieve the temperature coefficient of resistivity from the memory,
calculate an actual resistance of the resistor based on the known resistance, the temperature coefficient of resistivity, and the actual temperature, and
calculate actual current flow through the resistor based on the measured voltage drop and the actual resistance.

13. A battery post cover according to claim 11, wherein the computer further comprises a clock and the processor is programmed to calculate a total charge based on the current flow and the charge time.

14. A battery including the battery post cover of claim 8, and further including:
a case having an open top sealed by the first surface of the battery post cover;
a storage cell contained within the case for receiving and storing an electrical charge; and
an electrically conductive post connected to the storage cell and extending out of the case and through the post port of the cover, and wherein the inner surface of the collar of the terminal assembly is attached to the post.

15. A battery according to claim 14, wherein the storage cell includes lead and lead-oxide plates immersed in an acid electrolyte.

* * * * *